United States Patent
Ravipalli et al.

(10) Patent No.: US 12,476,639 B2
(45) Date of Patent: Nov. 18, 2025

(54) CHAINED COMMAND ARCHITECTURE FOR PACKET PROCESSING

(71) Applicant: Intel Corporation, Santa Clara, CA (US)

(72) Inventors: Sreedhar Ravipalli, Cupertino, CA (US); Jing Miao, Livermore, CA (US); Raghucharan Boddupalli, Bangalore (IN); Luan Bui, San Jose, CA (US); Dinesh Kotti, Saratoga, CA (US); Ranjini Rajeevan, Fremont, CA (US)

(73) Assignee: Altera Corporation, San Jose, CA (US)

( * ) Notice: Subject to any disclaimer, the term of this patent is extended or adjusted under 35 U.S.C. 154(b) by 626 days.

(21) Appl. No.: 17/855,970

(22) Filed: Jul. 1, 2022

(65) Prior Publication Data
US 2022/0337249 A1 Oct. 20, 2022

(51) Int. Cl.
*H03K 19/17736* (2020.01)
*H03K 19/17704* (2020.01)

(52) U.S. Cl.
CPC . *H03K 19/17744* (2013.01); *H03K 19/17708* (2013.01)

(58) Field of Classification Search
None
See application file for complete search history.

(56) References Cited

U.S. PATENT DOCUMENTS

| | | | |
|---|---|---|---|
| 10,187,064 B1 * | 1/2019 | Atsatt | H03K 19/17792 |
| 10,833,679 B2 | 11/2020 | Clark et al. | |
| 11,336,287 B1 * | 5/2022 | Rodriguez | G06F 15/7825 |
| 2016/0049941 A1 | 2/2016 | How et al. | |
| 2020/0183727 A1 * | 6/2020 | Rabi | G06F 9/45558 |

* cited by examiner

*Primary Examiner* — Anh Q Tran
(74) *Attorney, Agent, or Firm* — Fletcher Yoder, P.C.

(57) ABSTRACT

Systems or methods of the present disclosure may include a programmable logic device having a first portion of programmable elements configured to implement a user logic. The programmable logic device also includes a second portion of the programmable elements. The second portion is configured to implement an infrastructure processing unit (IPU) to enable the first portion of programmable elements to interface with a plurality of accelerator engines. The IPU is to receive a chained command to cause two or more accelerator engines of the plurality of accelerator engines to perform sequential operations on a data packet in response to the chained command.

20 Claims, 9 Drawing Sheets

CHAINED COMMAND ARCHITECTURE FOR PACKET PROCESSING

BACKGROUND

The present disclosure relates generally to programmable logic-based infrastructure processing units (IPU). More particularly, the present disclosure relates to a chained command architecture for infrastructure processing units (IPU).

IPUs facilitate computations and accelerations offloading from a processor or programmable fabric device. The IPU frees up resources for the programmable fabric device user to focus on more critical processing and increases overall performance. Specifically, the IPU provides a flexible combination of multiple acceleration engines via the IPU logic enables the programmable logic device user to process packets in a more efficient way on any specific application over using the programmable fabric of the programmable fabric device. However, when performing multiple operations on a packet the IPU may have multiple round trip communications with the processor or programmable fabric device increasing overall latency and/or increasing bandwidth consumption while performing the multiple operations using the acceleration engines.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
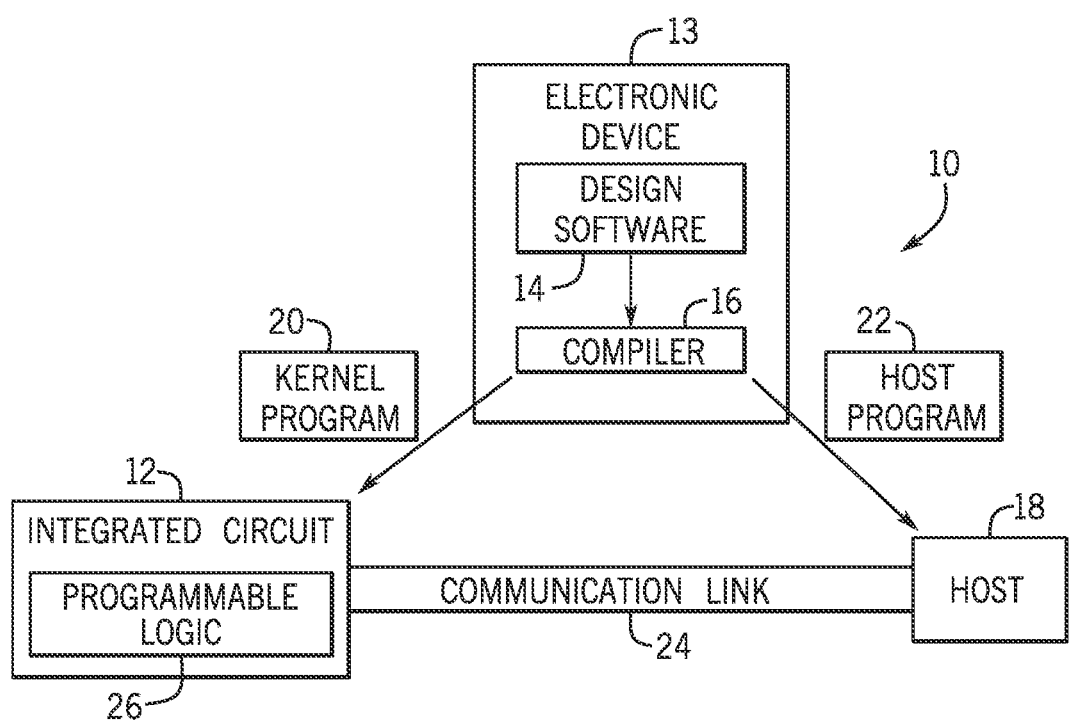
FIG. 1 is a block diagram of a system used to program an integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present systems and techniques relate to embodiments of an infrastructure processing unit (IPU) or other logic that performs multiple operations on data from a processor or circuitry (e.g., logic of a configuration configured in a programmable fabric). An IPU is a programmable network device that manages system level infrastructure resources by securely accelerating functions in a data center. The IPU (or other logic) may be implemented using a programmable logic device, such as a field programmable gate array (FPGA). Although the programmable logic device is referred to as an FPGA herein, the programmable logic device may include any other integrated circuit devices that include a programmable fabric, such as an application-specific integrated circuit with a programmable fabric. An FPGA-based IPU provides flexibility for users to develop application-based data flow. Configurations loaded on the FPGA acts as a command issuing unit and decide the order and number of operations on received packets from local or remote applications that are stored in a packet data buffer. However, to enable highly flexible command operations, the functions are to be flexible and also low latency for overall packet processing. One option is to send individual commands and wait for completion of the operation related to the command to be received back to the user logic or processor before issuing the next command. However, this waiting period increases the overall latency of packet processing. Furthermore, each independently performed operation may correspond to a memory access (e.g., read and/or write) increasing the consumption of bandwidth for a packet memory buffer. Instead, as discussed below, a command chain architecture may be used to support selective use of multiple packet operations to reduce the communication latency and memory bandwidth consumption for packet processing.

With the foregoing in mind, FIG. 1 illustrates a block diagram of a system 10 that may be used in configuring an integrated circuit. A designer may desire to implement functionality on an integrated circuit device 12 (e.g., a programmable logic device such as a field-programmable gate array (FPGA) or an application-specific integrated circuit (ASIC) that includes programmable logic circuitry). The integrated circuit device 12 may include a single integrated circuit, multiple integrated circuits in a package, or multiple integrated circuits in multiple packages communicating remotely (e.g., via wires or traces). In some cases, the designer may specify a high-level program to be implemented, such as an OPENCL® program that may enable the designer to more efficiently and easily provide programming instructions to configure a set of programmable logic cells for the integrated circuit device 12 without specific knowledge of low-level hardware description languages (e.g., Verilog, very high speed integrated circuit hardware description language (VHDL)). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

In a configuration mode of the integrated circuit device 12, a designer may use an electronic device 13 (e.g., a computer) to implement high-level designs (e.g., a system user design) using design software 14, such as a version of INTEL® QUARTUS® by INTEL CORPORATION. The electronic device 13 may use the design software 14 and a compiler 16 to convert the high-level program into a lower-level description (e.g., a configuration program, a bitstream). The compiler 16 may provide machine-readable instructions representative of the high-level program to a host 18 and the integrated circuit device 12. The host 18 may receive a host program 22 that may be implemented by the kernel programs 20. To implement the host program 22, the host 18 may communicate instructions from the host program 22 to the integrated circuit device 12 via a communications link 24 that may be, for example, direct memory access (DMA) communications or peripheral component interconnect express (PCIe) communications. In some embodiments, the kernel programs 20 and the host 18 may enable configuration of programmable logic 26 on the integrated circuit device 12. The programmable logic 26 may include circuitry and/or other logic elements and may be configurable to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Thus, embodiments described herein are intended to be illustrative and not limiting.

Figure 2:
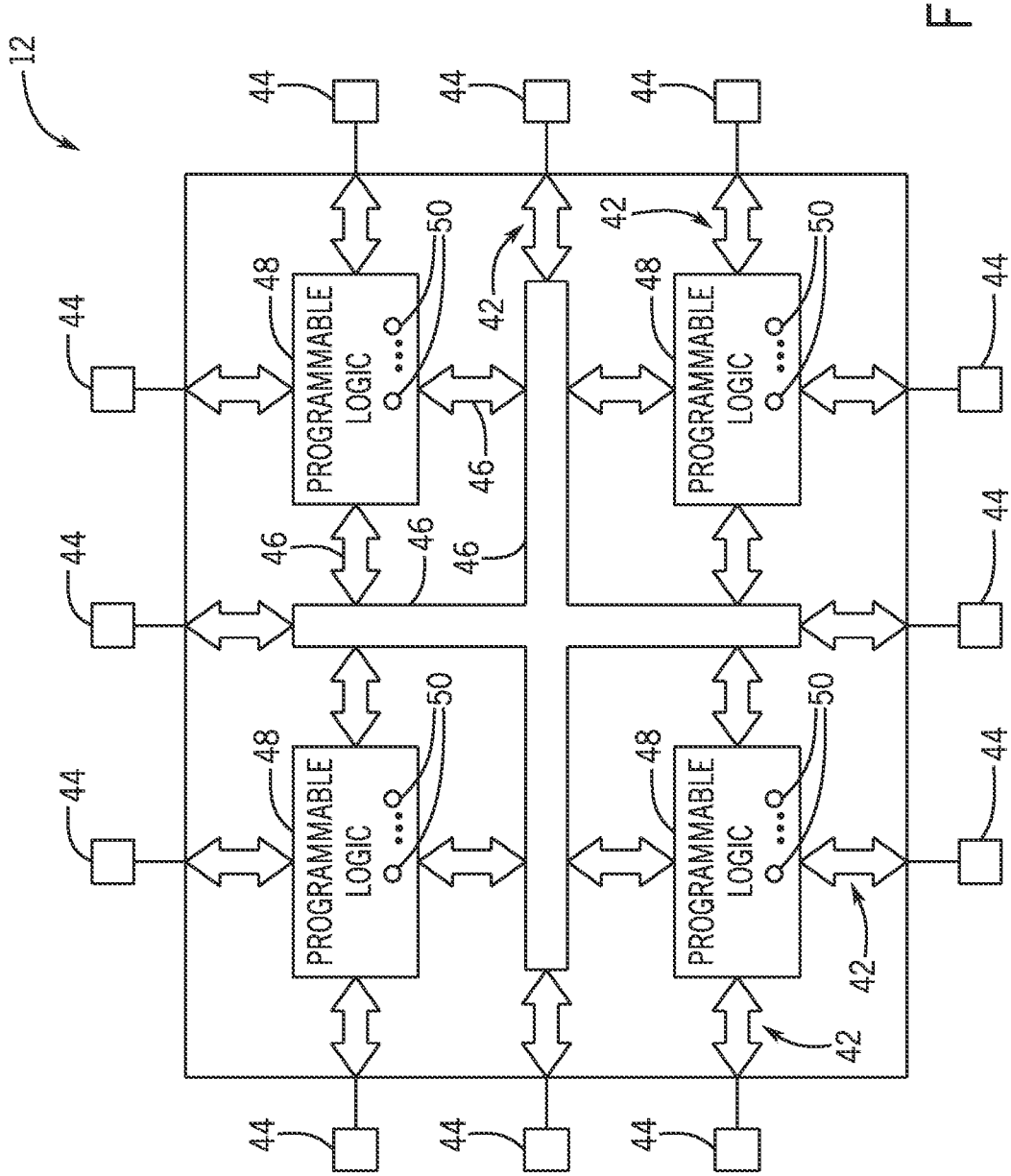
FIG. 2 is a block diagram of the integrated circuit device of FIG. 1, in accordance with an embodiment of the present disclosure.

Turning now to a more detailed discussion of the integrated circuit device 12, FIG. 2 is a block diagram of an example of the integrated circuit device 12 as a programmable logic device, such as a field-programmable gate array (FPGA). Further, it should be understood that the integrated circuit device 12 may be any other suitable type of programmable logic device (e.g., an ASIC and/or application-specific standard product). The integrated circuit device 12 may have input/output circuitry 42 for driving signals off of the device (e.g., integrated circuit device 12) and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit device 12. Additionally, interconnection resources 46 may include fixed interconnects (conductive lines) and programmable interconnects (i.e., programmable connections between respective fixed interconnects). Programmable logic 26 may include combinational and sequential logic circuitry. For example, programmable logic 26 may include look-up tables, registers, and multiplexers. In various embodiments, the programmable logic 26 may be configurable to perform a custom logic function. The programmable interconnects associated with interconnection resources may be considered to be a part of programmable logic 26.

Programmable logic devices, such as the integrated circuit device 12, may include programmable elements 50 with the programmable logic 26. For example, as discussed above, a designer (e.g., a user) may program (e.g., configure) or reprogram (e.g., reconfigure, partially reconfigure) the programmable logic 26 to perform one or more desired functions. By way of example, some programmable logic devices may be programmed or reprogrammed by configuring programmable elements 50 using mask programming arrangements that is performed during semiconductor manufacturing. Other programmable logic devices are configurable after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming (i.e., configuration), configuration data is loaded into the memory cells using input/output pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 26. For instance, in some embodiments, the output signals may be applied to the gates of metal-oxide-semiconductor (MOS) transistors within the programmable logic 26.

Keeping the discussion of FIG. 1 and FIG. 2 in mind, a user (e.g., designer) may use the design software 14 to configure the programmable logic 26 of the integrated circuit device 12 (e.g., with a user system design). In particular, the designer may specify in a high-level program that mathematical operations, such as addition and multiplication, be performed. The compiler 16 may convert the high-level program into a lower-level description that is used to configure the programmable logic 26 such that the programmable logic 26 may perform a function.

Figure 3:
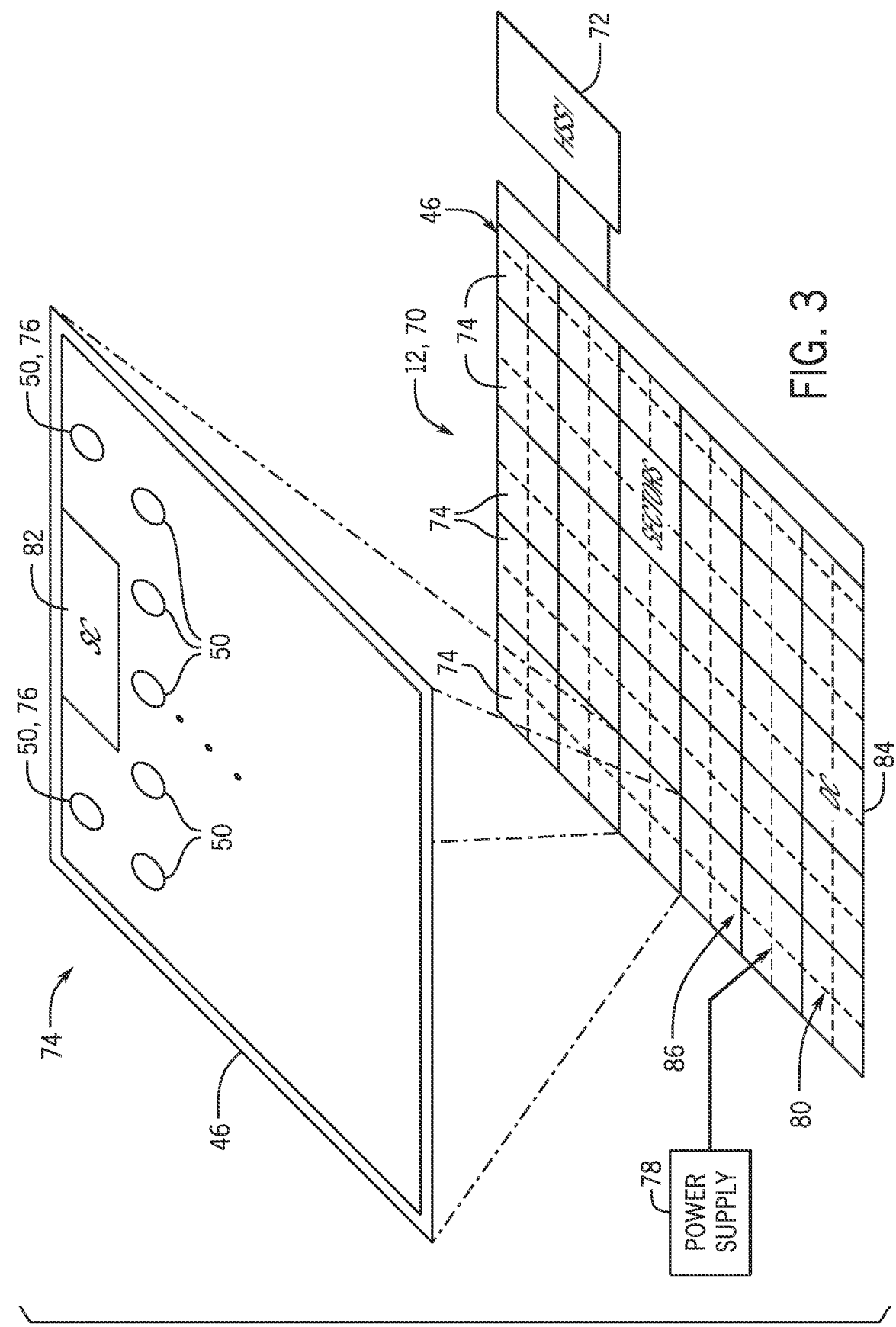
FIG. 3 is a diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the integrated circuit device 12 is referred to as an FPGA 70, though it should be understood that the device may be any suitable type of programmable logic device (e.g., an application-specific integrated circuit and/or application-specific standard product). In one example, the FPGA 70 is a sectorized FPGA of the type described in U.S. Patent Publication No. 2016/0049941, "Programmable Circuit Having Multiple Sectors," which is incorporated by reference in its entirety for all purposes. The FPGA 70 may be formed on a single plane. Additionally or alternatively, the FPGA 70 may be a three-dimensional FPGA having a base die and a fabric die of the type described in U.S. Pat. No. 10,833,679, "Multi-Purpose Interface for Configuration Data and User Fabric Data," which is incorporated by reference in its entirety for all purposes.

In the example of FIG. 3, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable elements 50 having operations defined by configuration memory 76 (e.g., CRAM).

A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84 that may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable element 50 or programmable component of the interconnection resources 46. The output signals of the configuration memory 76 may be applied to the gates of metal-oxide-semiconductor (MOS) transistors that control the states of the programmable elements 50 or programmable components of the interconnection resources 46.

As discussed above, some embodiments of the programmable logic fabric may be included in programmable fabric-based packages that include multiple die connected using, 2-D, 2.5-D, or 3-D interfaces. Each of the die may include logic and/or tiles that correspond to a power state and thermal level. Additionally, the power usage and thermal level of each die within the package may be monitored, and control circuitry may dynamically control operations of the one or more die based on the power data and thermal data collected.

Figure 4:
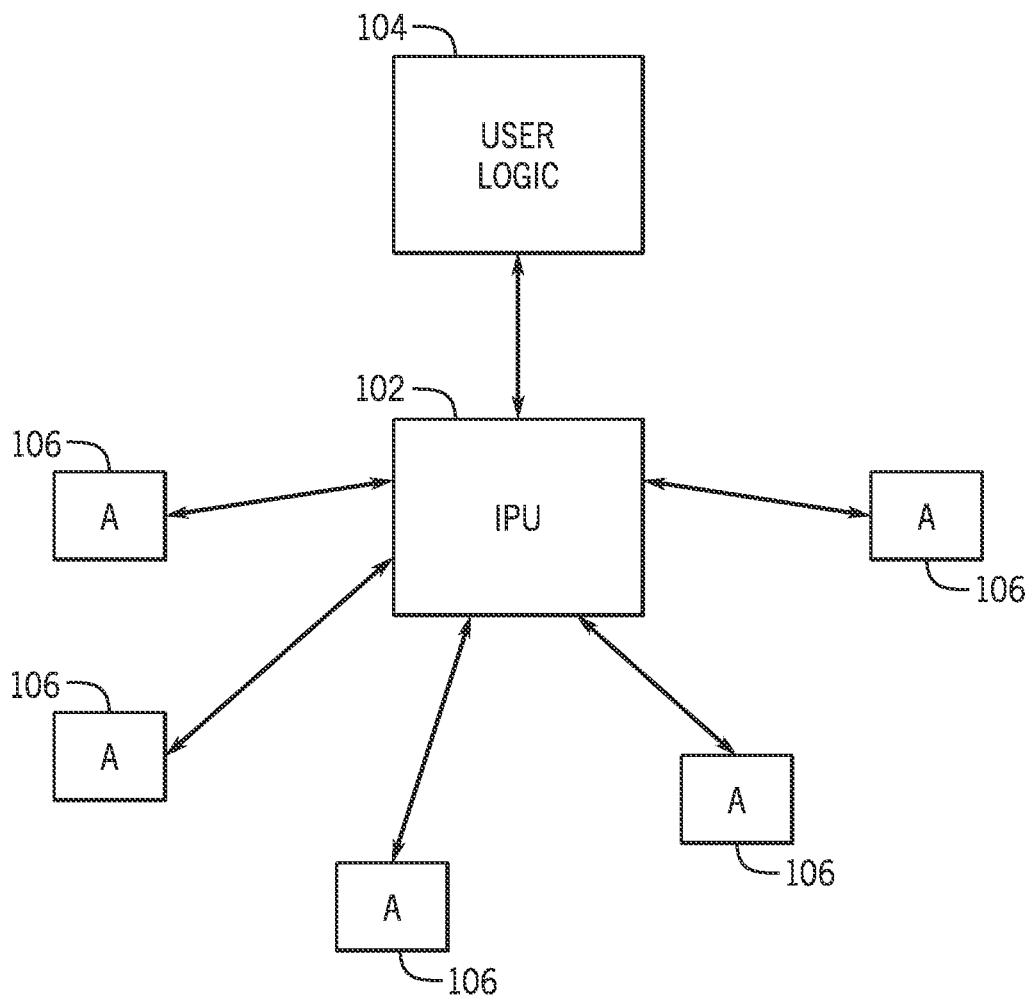
FIG. 4 is a block diagram of a system where user logic in the programmable fabric utilizes accelerator engines via an infrastructure processor unit (IPU), in accordance with an embodiment of the present disclosure.

FIG. 4 is a block diagram of a system 100 that includes and IPU 102. The IPU 102 is coupled to user logic 104 that is implemented using a configuration loaded into the programmable elements 50 of the integrated circuit device 12 or in a processor. The user logic 104, and thus a portion of the programmable fabric of the integrated circuit device 12, utilizes an IPU 102 to communicate with accelerator engines 106. The IPU 102 may also be implemented in programmable elements 50 of the integrated circuit device 12, may be implemented in programmable elements 50 of a programmable logic device different than the integrated circuit device 12 that implements the user logic 104, or any other suitable circuitry.

An FPGA fabric (e.g., user logic 104) communicates with its accelerator engines 106 via various commands. The fabric can issue multiple commands on how to process the data stored in local memory. For instance, the fabric may send cryptographic commands to accelerator engines 106 that are crypto engines (e.g., AES/SM4 GCM/XTS engines), may send check commands to cyclic redundancy check (CRC) engines and checksum engines for pre-crypto data and post-crypto data computations, and may send any other commands to accelerator engines 106 that perform other processing operations on the data. Indeed, although the following discusses cryptographic and CRC/checksum operations performed by corresponding accelerator engines, the accelerator engines 106 may perform any computations/operations that may be suitable for performance on data (e.g., a data packet).

In some embodiments, the fabric may send one command at a time with the IPU 102 reading the packet data from packet storage memory, executing the command on the packet, and sending a response to fabric before a next command is transmitted to the IPU 102. In such embodiments, based on the received response, the fabric sends another command to the IPU 102. For each command sent, there is a fixed amount of latency for a response to be returned to the fabric and for fabric to send the next command. If a packet is to be processed multiple times, the fabric sends multiple commands with multiple communications back and forth between the IPU 102 and the fabric. This back-and-forth communication increases the overall latency of packet processing.

Figure 5:
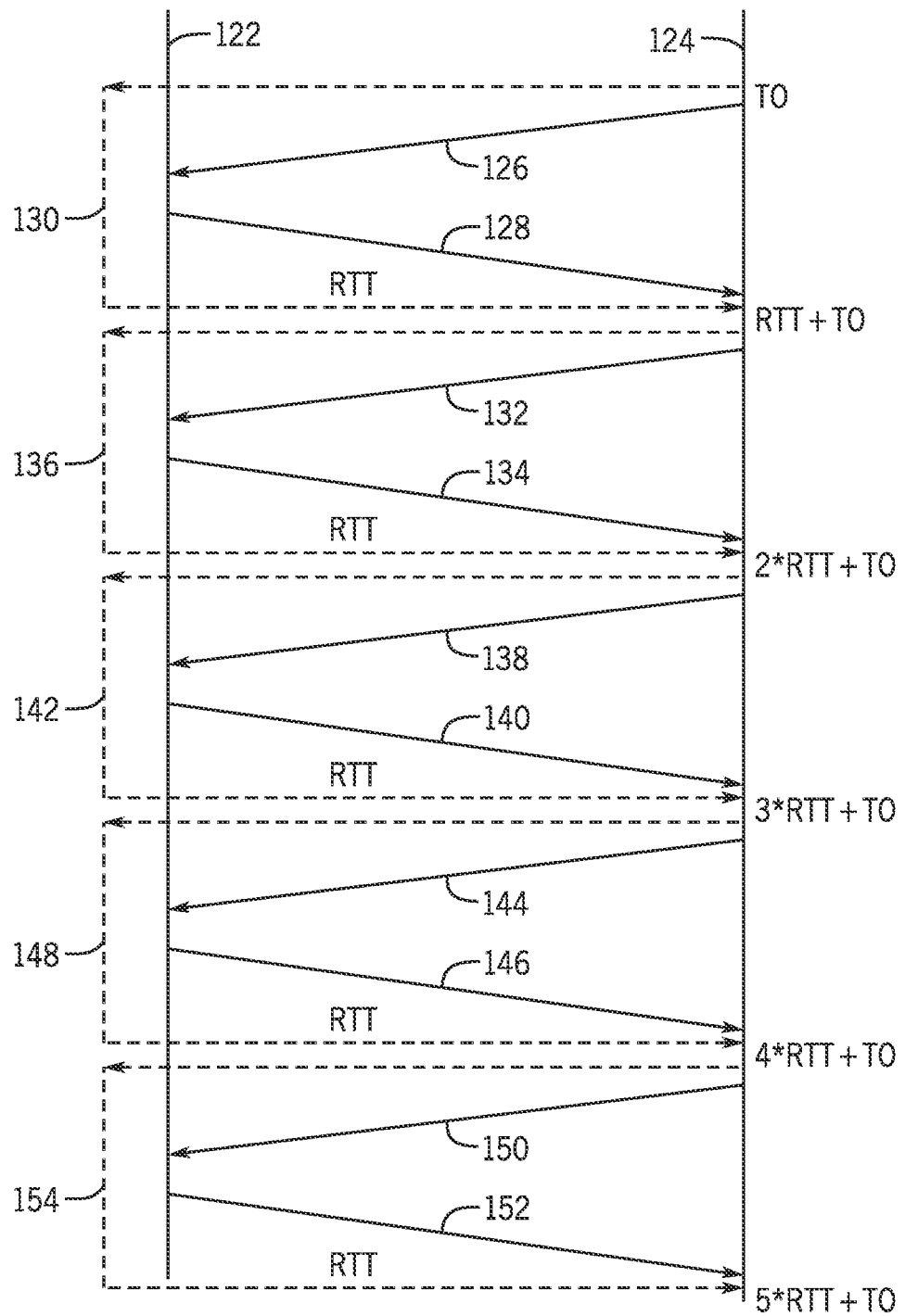
FIG. 5 is a flow diagram between the user logic and the IPU of FIG. 4, in accordance with an embodiment of the present disclosure.

For instance, FIG. 5 shows a flow diagram of a communication scheme 120 between an IPU 122 (e.g., IPU 102) and user fabric 124 (e.g., user logic 104). A data packet may be stored in the memory buffer of the IPU 122 then commands may be sent to the IPU 122 from the user fabric 124 to perform operations on the data packet. A first command 126 is transmitted from the user fabric 124 to the IPU 122. For example, the first command 126 may be a command to compute CRC values on the buffered packet using a user polynomial and system polynomial. When the IPU 122 receives the command, it reads the packet from the packet storage buffer and enables two CRC engines to compute the CRC values with one CRC engine to use the user CRC polynomial and the other CRC engine to use the system CRC polynomial. For the first command 126, the IPU 122 sends a response 128. Thus, to complete the first operation a round-trip time (RTT) 130 with communication back and forth between the user fabric 124 and the IPU 122 occurs.

In response to receiving the response 128, the user fabric 124 sends a second command 132. For example, the second command 132 may be to encrypt the packet. When the IPU 122 receives the second command 132, it reads the packet from the packet storage buffer and enables a cryptographic engine to encrypt the packet. The IPU 122 then writes the encrypted packet back to the packet storage buffer and sends a response 134 to the user fabric 124. Thus, performance of the second command 132 includes another RTT 136.

In response to the response 134, the user fabric 124 sends a third command 138 to the IPU 122. The third command 138 requests the IPU 122 to compute CRC values on the encrypted packet using a user polynomial and system polynomial. When IPU 122 receives the third command 138, it reads the encrypted packet from the packet storage buffer and enables two CRC engines to compute CRC values with one CRC engine to use the user CRC polynomial and the other CRC engine to use the system CRC polynomial. For the third command 138, the IPU 122 sends a response 140. Thus, to complete the third operation a RTT 142 with communication back and forth between the user fabric 124 and the IPU 122.

In response to the response 140, the user fabric 124 sends a fourth command 144. For instance, the fourth command 144 may be a command to decrypt the packet. When IPU 122 receives the fourth command 144, it reads the encrypted packet from the packet storage buffer and enables crypto engine to decrypt the packet. The IPU 122 then writes the decrypted packet back to the packet storage buffer and sends a response 146 to the user fabric 124. Thus, performance of the fourth command 144 includes another RTT 148.

In response to the response 146, the user fabric 124 sends a fifth command 150 to the IPU 122. For instance, the fifth command 150 may be a command compute CRC values on the decrypted packet using a user polynomial and/or a system polynomial. When the IPU 122 receives the command, it reads the decrypted packet from the packet storage buffer and enables the two CRC engines to compute CRC values with one CRC engine is to use the user CRC polynomial and the other CRC engine is to use the system CRC polynomial and can validate the computed CRC values on the decrypted packet and send a response 152 to the user fabric 124. The computed CRC values and validate status are received by user fabric 124 (e.g., in the response 152). Thus, performance of the fifth command 150 includes another RTT 154.

The different RTTs may be different durations than each other, may be the same as each other, or a combination with some being equal while others are not equal. In the above packet processing, five commands are sent by user fabric 124, with two write accesses to the packet storage buffer and five read accesses to the packet storage buffer. These accesses may negatively impact a latency and/or a memory bandwidth for the system 100.

Figure 6:
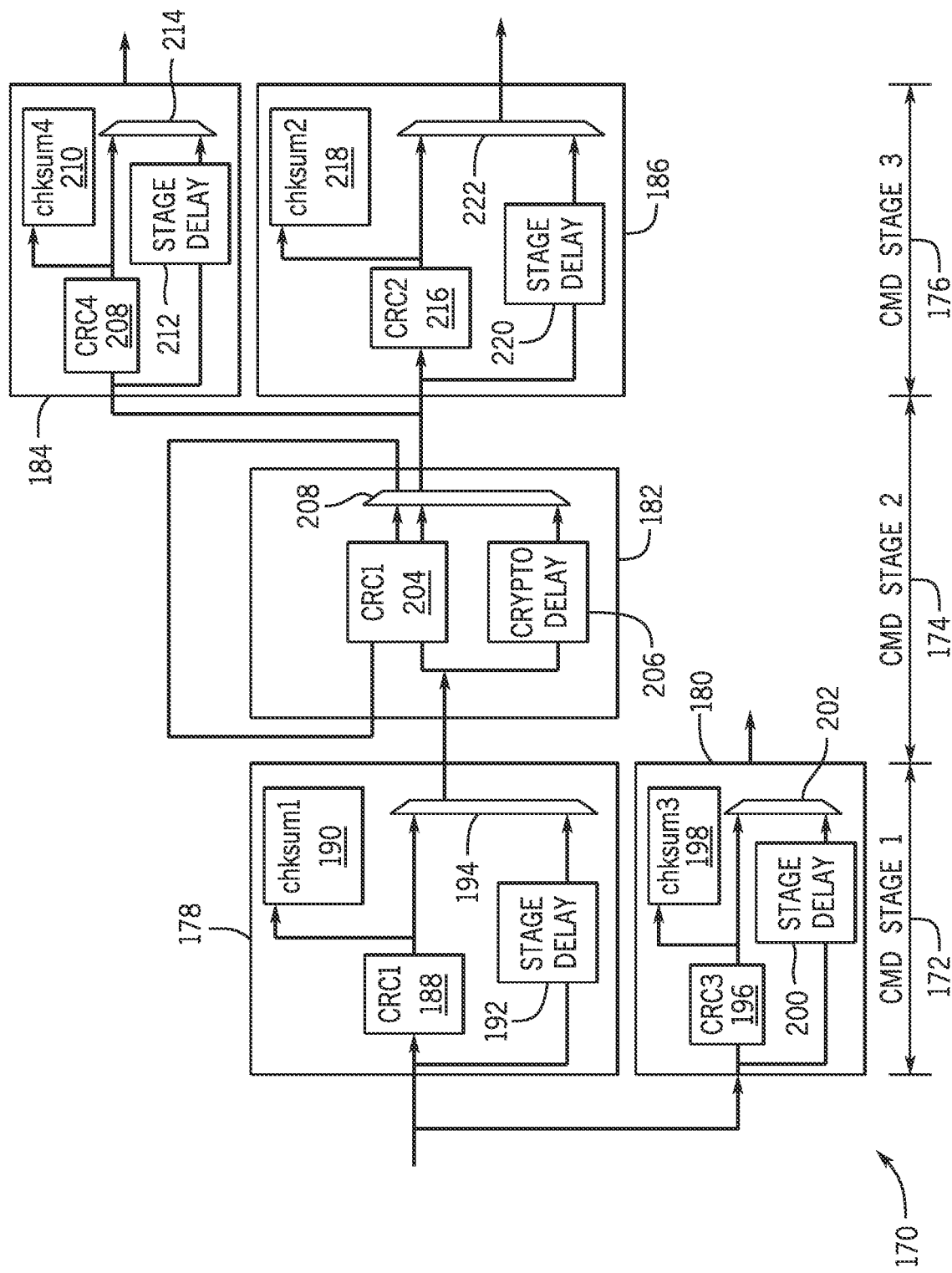
FIG. 6 is a block diagram of a chained command architecture using CRC and crypto engines, in accordance with an embodiment of the present disclosure.

FIG. 6 is a block diagram of a chained command architecture 170 implemented in the IPU 122 and/or other parts of the programmable fabric for use by the IPU 122. The chained command architecture 170 includes accelerator engines connected in a chained configuration in a number of stages. For example, the illustrated chained command architecture 170 has accelerator engines arranged in three stages: CMD stage 1 172, CMD stage 2 174, and CMD stage 3 176. The CMD stage 1 172 includes two CRC/checksum engines 178 and 180. The CMD stage 2 174 includes a crypto engine 182. The CMD stage 3 186 includes CRC/checksum engines 184 and 186.

The functions performed in the chained command architecture 170 may be performed using a single command from user fabric 124 and only one read from the packet storage memory. Specifically, the CRC/checksum engines 178 and 180 may perform the operations associated with the command 126 to perform CRC/checksum operations using user polynomials and system polynomials. The operations in the CRC/checksum engines 178 and 180 may be initiated using the single command and loading the packet from the packet storage memory to both of the CRC/checksum engines 178 and 180 simultaneously.

The CRC/checksum engine 178 may include CRC circuitry 188 that performs a first CRC computation using a first polynomial (e.g., user polynomial or system polynomial). The output of the CRC circuitry 188 is then checked using checksum circuitry 190. The CRC/checksum operation of the CRC/checksum engine 178 may be skipped in the CRC/checksum engine 178. Thus, a delay 192 may be added to keep the duration for the packet to traverse the CMD stage 1 172 consistent whether the function of the CRC/checksum engine 178 is bypassed or not. A multiplexer/demultiplexer 194 may be used to select between the output of the CRC circuitry 188 or the output from the delay 192 as the output of the CRC/checksum engine 178.

The CRC/checksum engine 180 may include CRC circuitry 196 that performs a second CRC computation using a second polynomial (e.g., user polynomial or system polynomial). The output of the CRC circuitry 196 is then checked using checksum circuitry 198. The CRC/checksum operation of the CRC/checksum engine 180 may be skipped in the CRC/checksum engine 180. Thus, a delay 200 may be added to keep the duration for the packet to traverse the CMD stage 1 172 consistent whether the function of the CRC/checksum engine 180 is bypassed or not. A multiplexer/demultiplexer 202 may be used to select between the output of the CRC circuitry 196 or the output from the delay 200 as the output of the CRC/checksum engine 180.

The crypto engine 182 may include crypto circuitry 204 that is used to perform a cryptographic function (e.g., encryption) on the data packet that had been used to calculate CRC in the CRC/checksum engine 178. The crypto engine 182 may enable bypassing of the cryptographic function by incorporating a delay 206 through which the incoming packet is also routed. The duration of the delay 206 may be set to keep the duration for the packet to traverse the CMD stage 2 174 the same whether the cryptographic function is applied to the packet that is output from the CMD stage 2 174 or not applied. A multiplexer/demultiplexer 202 may be used to select between the output of the crypto circuitry 204 or the output from the delay 206 as the output of the crypto engine 182. For validation purposes, the command chain architecture 170 may transmit the encrypted packet back through the crypto circuitry 204 to cause the encrypted packet to be unencrypted then computation/validation of the CRC values.

The unencrypted (or encrypted packet) is then transmitted to the CRC/checksum engines 184 and 186. The CRC/checksum engine 184 may include CRC circuitry 208 that performs a third CRC computation using the first polynomial (e.g., user polynomial or system polynomial). The output of the CRC circuitry 208 is then checked using checksum circuitry 210. The CRC/checksum operation of the CRC/checksum engine 184 may be skipped in the CRC/checksum engine 184. Thus, a delay 212 may be added to keep the duration for the packet to traverse the CMD stage 3 176 consistent whether the function of the CRC/checksum engine 184 is bypassed or not. A multiplexer/demultiplexer 214 may be used to select between the output of the CRC circuitry 208 or the output from the delay 212 as the output of the CRC/checksum engine 184.

The CRC/checksum engine 186 may include CRC circuitry 216 that performs a third CRC computation using the second polynomial (e.g., user polynomial or system polynomial). The output of the CRC circuitry 216 is then checked using checksum circuitry 218. The CRC/checksum operation of the CRC/checksum engine 186 may be skipped in the CRC/checksum engine 186. Thus, a delay 220 may be added to keep the duration for the packet to traverse the CMD stage 3 176 consistent whether the function of the CRC/checksum engine 186 is bypassed or not. A multiplexer/demultiplexer 222 may be used to select between the output of the CRC circuitry 216 or the output from the delay 220 as the output of the CRC/checksum engine 186. In some embodiments, the CRC/checksum engines 184 and 186 may be used to validate encrypted packet after encryption and then also to validate the decrypted packet after decryption of the encrypted packet. Alternatively, a first set of CRC/checksum engines may be used on the encrypted packet while a second set of CRC/checksum engines is used on the decrypted packet.

Figure 7:
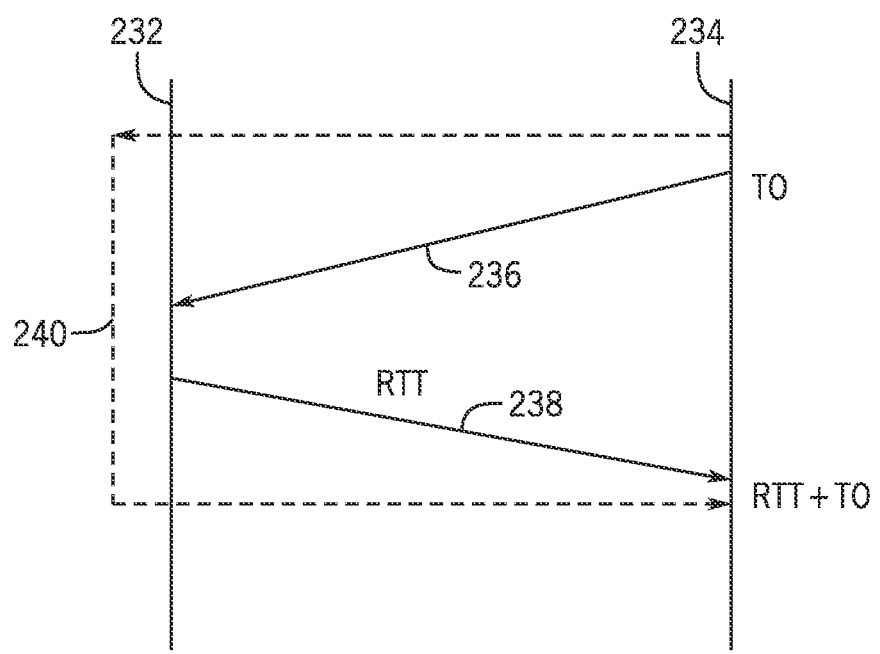
FIG. 7 is a flow diagram between the user logic and the IPU using the chained command architecture of FIG. 6, in accordance with an embodiment of the present disclosure.

The command chain architecture 170 combines the commands 126, 132, 138, 144, and 150 into one single command. Furthermore, due to the command chain architecture 170, the IPU 122 reads the packet from packet storage buffer once. The IPU 122 then handles the command sequentially internally using the command chain architecture to feed the packet forward without additional commands or reads from the packet storage buffer. This scheme saves the round-trip time latency for command and response exchanges between the user fabric 124 and the IPU 122. It also reduces the memory bandwidth consumption in accessing the packet storage buffer. Specifically, FIG. 7 shows a flow diagram of a communication scheme 230 between an IPU 232 (e.g., IPU 102) and user fabric 234 (e.g., user logic 104).

As illustrated, the user fabric 234 sends a command 236 to the IPU 232 that corresponds to multiple operations, such as the multiple pre-crypto CRC/checksum operations, the crypto operations (e.g., encrypt and/or decrypt), and the multiple-post crypto CRC/checksum operations discussed in relation to FIG. 6 above. For instance, the single command may include a series of computing CRC using different polynomials on a packet then encrypting the packet then computing CRC using different polynomials then decrypting the packet and computing/validating CRC values on the decrypted packet. In other words, the single command may be used to complete multiple (e.g., 5) operations in response to the single command. Thus, the IPU 122 sends a single response 238 (e.g., write to the packet storage buffer) to complete multiple operations to complete the RTT 240.

Figure 8:
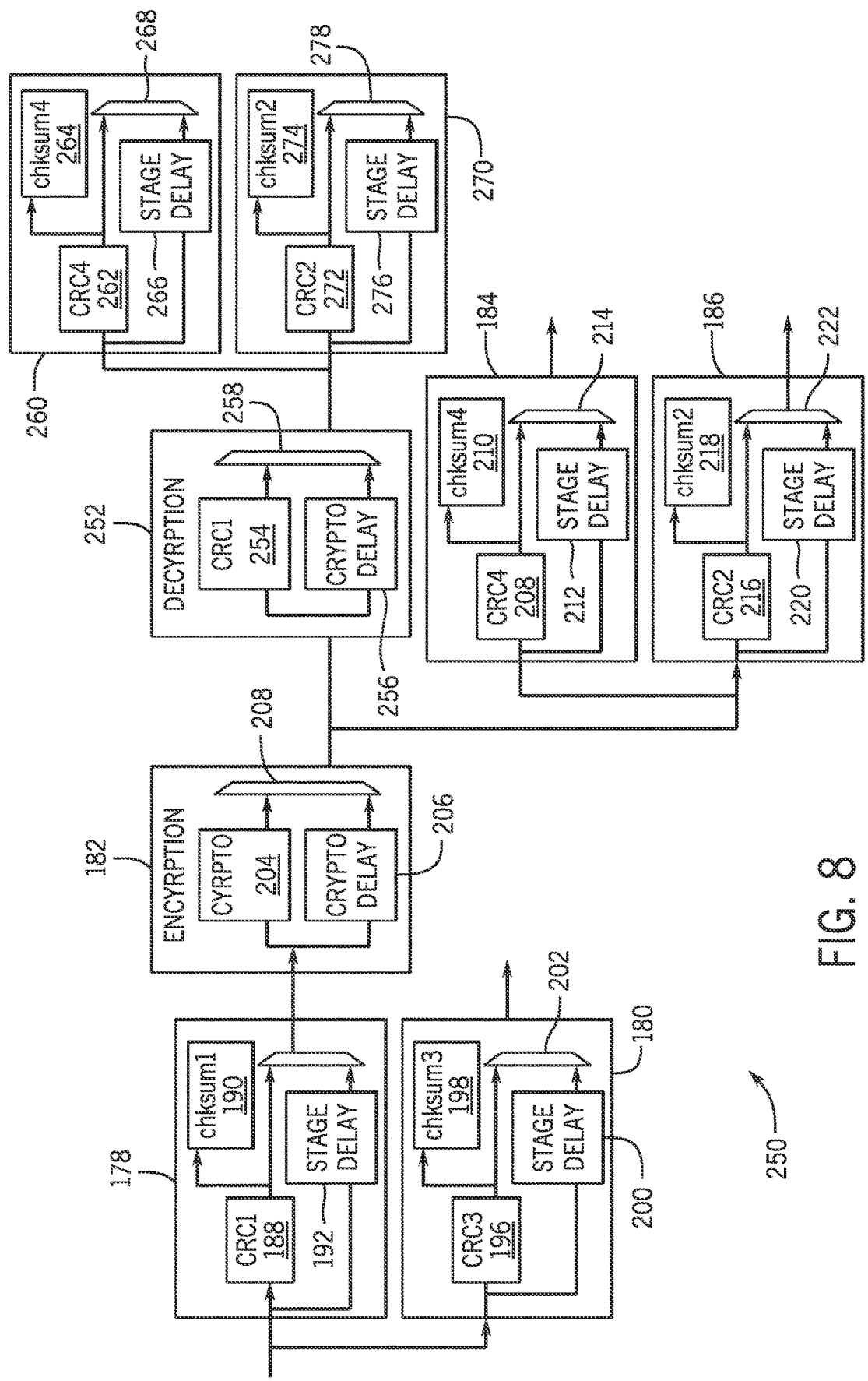
FIG. 8 is a block diagram of a chained command architecture using CRC, encryption, and decryption engines, in accordance with an embodiment of the present disclosure.

If a particular function (e.g., decryption) is not to be used for a particular operation the operation may be disabled by disabling (e.g., using a reconfiguration or partial reconfiguration of the programmable fabric) such engines in the chained command architecture 170. For instance, FIG. 8 shows a chained command architecture 250 where encryption and decryption have been separated into different engines with the encrypted packet and the decrypted packets being validated in different CRC/checksum engines. A crypto engine 252 is used to perform decryption while the crypto engine 182 performs encryption. Using the flexibility of utilizing the programmable logic fabric-based IPU 122, the crypto engine 252 may be disabled. In other words, the programmable logic fabric may be used to enable and disable the number of operations in the command chain.

The crypto engine 252 may include crypto circuitry 254 that is used to perform a cryptographic function (e.g., decryption) on the data packet that has been encrypted in the crypto engine 182. The crypto engine 252 may enable bypassing of the cryptographic function by incorporating a delay 256 through which the incoming packet is also routed. The duration of the delay 256 may be set to keep the duration for the packet to traverse the corresponding stage the same whether the cryptographic function is applied to the packet that is output from the stage or not applied. A multiplexer/demultiplexer 258 may be used to select between the output of the crypto circuitry 254 or the output from the delay 256 as the output of the crypto engine 252.

The crypto engine 252 may output the decrypted packet to CRC/checksum engines 260 and 270. The CRC/checksum engine 260 may include CRC circuitry 262 that performs a CRC computation using the first polynomial (e.g., user polynomial or system polynomial) when the crypto engine 252 and the CRC/checksum engine 260 are active. The output of the CRC circuitry 262 is then checked using checksum circuitry 264. The CRC/checksum operation of the CRC/checksum engine 260 may be skipped in the CRC/checksum engine 260. Thus, a delay 266 may be added to keep the duration for the packet to traverse the stage consistent whether the function of the CRC/checksum engine 260 is bypassed or not. A multiplexer/demultiplexer 268 may be used to select between the output of the CRC circuitry 262 or the output from the delay 266 as the output of the CRC/checksum engine 260.

The CRC/checksum engine 270 may include CRC circuitry 272 that performs a CRC computation using the second polynomial (e.g., user polynomial or system polynomial) when the crypto engine 252 and the CRC/checksum engine 270 are active. The output of the CRC circuitry 272 is then checked using checksum circuitry 274. The CRC/ checksum operation of the CRC/checksum engine 270 may be skipped in the CRC/checksum engine 270. Thus, a delay 276 may be added to keep the duration for the packet to traverse the stage consistent whether the function of the CRC/checksum engine 270 is bypassed or not. A multiplexer/demultiplexer 278 may be used to select between the output of the CRC circuitry 272 or the output from the delay 276 as the output of the CRC/checksum engine 260.

Figure 9:
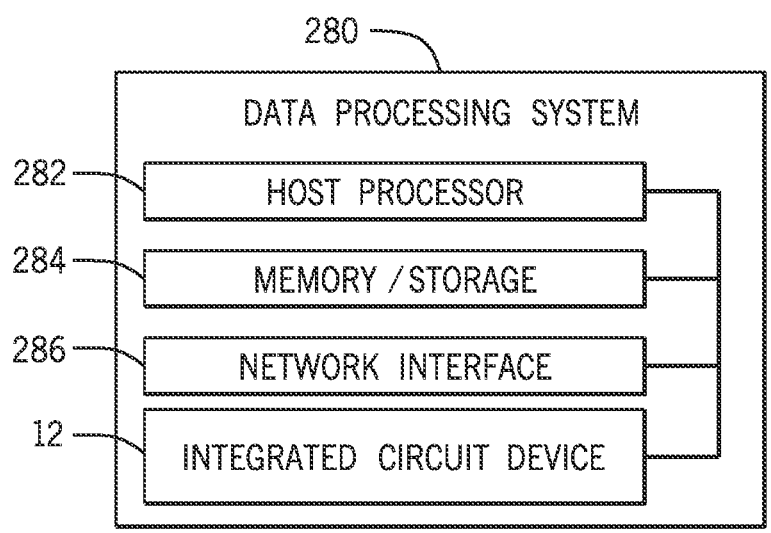
FIG. 9 is a data processing system, in accordance with an embodiment of the present disclosure.

The integrated circuit device 12 may be a data processing system or a component included in a data processing system. For example, the integrated circuit device 12 may be a component of a data processing system 280 shown in FIG. 9. The data processing system 280 may include a host processor 282 (e.g., a central-processing unit (CPU)), memory and/or storage circuitry 284, and a network interface 286. The data processing system 280 may include more or fewer components (e.g., electronic display, user interface structures, application specific integrated circuits (ASICs)). The host processor 282 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 280 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 284 may include random access memory (RAM), read-only memory (ROM), one or more hard drives, flash memory, or the like. The memory and/or storage circuitry 284 may hold data to be processed by the data processing system 280. In some cases, the memory and/or storage circuitry 284 may also store configuration programs (bitstreams) for programming the integrated circuit device 12. The network interface 286 may allow the data processing system 280 to communicate with other electronic devices. The data processing system 280 may include several different packages or may be contained within a single package on a single package substrate.

In one example, the data processing system 280 may be part of a data center that processes a variety of different requests. For instance, the data processing system 280 may receive a data processing request via the network interface 286 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. A programmable logic device comprising: a first portion of programmable elements configured to implement a user logic; and a second portion of the programmable elements configured to implement an infrastructure processing unit (IPU) to enable the first portion of programmable elements to interface with a plurality of accelerator engines, wherein the IPU is to receive a chained command to cause two or more accelerator engines of the plurality of accelerator engines to perform sequential operations on a data packet in response to the chained command.

EXAMPLE EMBODIMENT 2. The programmable logic device of example embodiment 1, wherein a subset of the second portion of the programmable elements are used to implement the two or more of the plurality of accelerator engines.

EXAMPLE EMBODIMENT 3. The programmable logic device of example embodiment 1, wherein the two or more accelerator engines are arranged in a plurality of stages, wherein a first stage of the plurality of stages receives the data packet in response to the command.

EXAMPLE EMBODIMENT 4. The programmable logic device of example embodiment 3, wherein receiving the data packet comprises reading the data packet from a packet data buffer.

EXAMPLE EMBODIMENT 5. The programmable logic device of example embodiment 3, wherein a second stage of the plurality of stages receives the data packet from the first stage after a first operation corresponding to the stage is performed.

EXAMPLE EMBODIMENT 6. The programmable logic device of example embodiment 5, wherein the transmission of the data packet from the first stage to the second stage is performed without reading or writing data to the packet data buffer.

EXAMPLE EMBODIMENT 7. The programmable logic device of example embodiment 5, wherein the first stage comprises one or more cyclic redundancy check engines.

EXAMPLE EMBODIMENT 8. The programmable logic device of example embodiment 7, wherein a cyclic redundancy check engine of the cyclic redundancy check engines comprises cyclic redundancy check circuitry that performs cyclic redundancy computations on the packet.

EXAMPLE EMBODIMENT 9. The programmable logic device of example embodiment 8, wherein the cyclic redundancy check engine of the cyclic redundancy check engines comprises checksum circuitry that checks the output of the cyclic redundancy check circuitry.

EXAMPLE EMBODIMENT 10. The programmable logic device of example embodiment 7, wherein the second stage comprises a crypto engine to encrypt the packet received from the cyclic redundancy check engine.

EXAMPLE EMBODIMENT 11. The programmable logic device of example embodiment 1, wherein the IPU makes a single write to the data packet buffer in response to the single command.

EXAMPLE EMBODIMENT 12. A programmable logic device comprising: a device controller that transmits commands; and a plurality of programming elements, wherein the plurality of programming elements is configured to implement: user logic configured to perform operations based on a configuration loaded into the plurality of programming elements; and an infrastructure processing unit (IPU) that is configured to implement a chained command architecture that is configured to perform multiple operations in multiple chained accelerator engines in response to a single command of the commands.

EXAMPLE EMBODIMENT 13. The programmable logic device of example embodiment 12, wherein the plurality of programming elements are configured to implement the multiple chained accelerator engines.

EXAMPLE EMBODIMENT 14. The programmable logic device of example embodiment 13, wherein the multiple chained accelerator engines are implemented in the infrastructure processing unit.

EXAMPLE EMBODIMENT 15. The programmable logic device of example embodiment 14, wherein the multiple operations are performed using a single read and write to a packet data buffer.

EXAMPLE EMBODIMENT 16. The programmable logic device of example embodiment 12, wherein the multiple operations are distributed among a plurality of sequential stages.

EXAMPLE EMBODIMENT 17. The programmable logic device of example embodiment 16, wherein the sequential stages correspond to a defined order of operations.

EXAMPLE EMBODIMENT 18. The programmable logic device of example embodiment 17, wherein the defined order of operations comprises a pre-cryptographic cyclic redundancy check operation then an encryption operation then a post-cryptographic cyclic redundancy check operation.

EXAMPLE EMBODIMENT 19. A programmable fabric device having programmable elements comprising: a first portion of the programmable elements configured to perform user-defined functions via a configuration loaded into the first portion of the programmable elements; and a second portion of the programmable elements configured to implement an infrastructure processing unit that comprises a plurality of accelerator engines arranged sequentially in a chained command architecture that is to perform multiple operations in response to a single command, wherein performing the multiple operations comprises a single read to a data packet buffer and a single write to the data packet buffer.

EXAMPLE EMBODIMENT 20. The programmable fabric device of example embodiment 19, wherein the second portion of the programmable elements is configured to disable at least some of the multiple operations for a subsequent command using a reconfiguration of the second portion of the programmable elements.

What is claimed is:

1. A programmable logic device comprising:
a first portion of programmable elements configured to implement a user logic; and
a second portion of the programmable elements configured to implement an infrastructure processing unit (IPU) to enable the first portion of programmable elements to interface with a plurality of accelerator engines, wherein the IPU is to receive a chained command to cause two or more accelerator engines of the plurality of accelerator engines to perform sequential operations on a data packet in response to the chained command.

2. The programmable logic device of claim 1, wherein a subset of the second portion of the programmable elements are used to implement the two or more of the plurality of accelerator engines.

3. The programmable logic device of claim 1, wherein the two or more accelerator engines are arranged in a plurality of stages, wherein a first stage of the plurality of stages receives the data packet in response to the command.

4. The programmable logic device of claim 3, wherein receiving the data packet comprises reading the data packet from a packet data buffer.

5. The programmable logic device of claim 4, wherein a second stage of the plurality of stages receives the data packet from the first stage after a first operation corresponding to the stage is performed.

6. The programmable logic device of claim 5, wherein transmission of the data packet from the first stage to the second stage is performed without reading or writing data to the packet data buffer.

7. The programmable logic device of claim 5, wherein the first stage comprises one or more cyclic redundancy check engines.

8. The programmable logic device of claim 7, wherein a cyclic redundancy check engine of the cyclic redundancy check engines comprises cyclic redundancy check circuitry that performs cyclic redundancy computations on the packet.

9. The programmable logic device of claim 8, wherein the cyclic redundancy check engine of the cyclic redundancy check engines comprises checksum circuitry that validates an output of the cyclic redundancy check circuitry.

10. The programmable logic device of claim 7, wherein the second stage comprises a crypto engine to encrypt the packet received from the cyclic redundancy check engine.

11. The programmable logic device of claim 1, wherein the IPU makes a single write to a data packet buffer in response to the chained command.

12. A programmable logic device comprising:
a device controller that transmits commands; and
a plurality of programming elements, wherein the plurality of programming elements is configured to implement:
user logic configured to perform operations based on a configuration loaded into the plurality of programming elements; and
an infrastructure processing unit (IPU) that is configured to implement a chained command architecture that is configured to perform multiple operations in multiple chained accelerator engines in response to a single command of the commands.

13. The programmable logic device of claim 12, wherein the plurality of programming elements are configured to implement the multiple chained accelerator engines.

14. The programmable logic device of claim 13, wherein the multiple chained accelerator engines are implemented in the infrastructure processing unit.

15. The programmable logic device of claim 14, wherein the multiple operations are performed using a single read and write to a packet data buffer.

16. The programmable logic device of claim 12, wherein the multiple operations are distributed among a plurality of sequential stages.

17. The programmable logic device of claim 16, wherein the sequential stages correspond to a defined order of operations.

18. The programmable logic device of claim 17, wherein the defined order of operations comprises a pre-cryptographic cyclic redundancy check operation then an encryption operation then a post-cryptographic cyclic redundancy check operation.

19. A programmable fabric device having programmable elements comprising:
- a first portion of the programmable elements configured to perform user-defined functions via a configuration loaded into the first portion of the programmable elements; and
- a second portion of the programmable elements configured to implement an infrastructure processing unit that comprises a plurality of accelerator engines arranged sequentially in a chained command architecture that is to perform multiple operations in response to a single command, wherein performing the multiple operations comprises a single read to a data packet buffer and a single write to the data packet buffer.

20. The programmable fabric device of claim 19, wherein the second portion of the programmable elements is configured to disable at least some of the multiple operations for a subsequent command using a reconfiguration of the second portion of the programmable elements.

\* \* \* \* \*